United States Patent
Jin et al.

(10) Patent No.: US 8,778,212 B2
(45) Date of Patent: Jul. 15, 2014

(54) CMP COMPOSITION CONTAINING ZIRCONIA PARTICLES AND METHOD OF USE

(75) Inventors: Wiechang Jin, Madison, WI (US); John Parker, Naperville, IL (US); Elizabeth Remsen, Oswego, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 5 days.

(21) Appl. No.: 13/477,535

(22) Filed: May 22, 2012

(65) Prior Publication Data

US 2013/0313225 A1  Nov. 28, 2013

(51) Int. Cl.
- *B44C 1/22* (2006.01)
- *C03C 15/00* (2006.01)
- *C03C 25/68* (2006.01)
- *C23F 1/00* (2006.01)

(52) U.S. Cl.
USPC ............................ 216/89; 252/79.1; 438/693

(58) Field of Classification Search
USPC ............................ 216/89; 438/693; 252/79.1
See application file for complete search history.

(56) References Cited

U.S. PATENT DOCUMENTS

| | | | |
|---|---|---|---|
| 6,454,819 B1 * | 9/2002 | Yano et al. | 51/298 |
| 6,582,623 B1 | 6/2003 | Grumbine et al. | |
| 6,646,348 B1 | 11/2003 | Grumbine et al. | |
| 7,044,836 B2 | 5/2006 | Sun et al. | |
| 7,247,256 B2 | 7/2007 | Park et al. | |
| 7,265,055 B2 | 9/2007 | Thompson et al. | |
| 7,294,576 B1 | 11/2007 | Chen et al. | |
| 2003/0124959 A1 * | 7/2003 | Schroeder et al. | 451/41 |
| 2004/0209555 A1 | 10/2004 | Sun et al. | |
| 2004/0214443 A1 | 10/2004 | Grumbine et al. | |
| 2005/0112894 A1 | 5/2005 | Park et al. | |
| 2006/0108325 A1 | 5/2006 | Everson et al. | |
| 2008/0003829 A1 | 1/2008 | Shin et al. | |
| 2009/0124173 A1 | 5/2009 | Li | |
| 2009/0186053 A1 | 7/2009 | Meyer et al. | |
| 2010/0068883 A1 | 3/2010 | Shin et al. | |
| 2010/0178768 A1 | 7/2010 | Li | |
| 2010/0200802 A1 | 8/2010 | Grumbine et al. | |
| 2011/0100956 A1 | 5/2011 | Keleher et al. | |

FOREIGN PATENT DOCUMENTS

| | | |
|---|---|---|
| EP | 1 620 518 B1 | 2/2006 |
| WO | WO 2004/094547 A2 | 11/2004 |
| WO | WO 2007/058774 A1 | 5/2007 |
| WO | WO 2008/082177 A1 | 7/2008 |
| WO | WO 2008/157293 A1 | 12/2008 |
| WO | WO 2009/032065 A1 | 3/2009 |

OTHER PUBLICATIONS

Hiroki et al., "Decomposition of Hydrogen Peroxide at Water-Ceramic Oxide Interfaces," *J. Phys. Chem. B.*, 109: 3364-3370 (2005).
Kim et al., "Effects of phosphoric acid stabilizer on copper and tantalum nitride CMP," *Materials Letters*, 57: 4601-4604 (2003).
Kim et al., "Development of a Copper Chemical Mechanical Polishing Slurry at Neutral pH Based on Ceria Slurry," *Journal of The Electrochemical Society*, 157(10): H952-H958 (2010).
Manivannan et al., "The effect of hydrogen peroxide on polishing removal rate in CMP with various abrasives," *Applied Surface Science*, 255: 3764-3768 (2009).
Skovgaard et al., "Stabilization of metastable tetragonal zirconia nanocrystallites by surface modification," *J. Mater. Sci.*, 46: 1824-1829 (2010).
Zhang et al., "Surface modification of ceria nanoparticles and their chemical mechanical polishing behavior on glass substrate," *Applied Surface Science*, 256: 3856-3861 (2010).

* cited by examiner

*Primary Examiner* — Roberts Culbert
(74) *Attorney, Agent, or Firm* — Thomas E Omholt; Alisha K Bull; Steven D Weseman

(57) ABSTRACT

The invention provides a chemical-mechanical polishing composition containing zirconia particles, a modifying agent that adheres to the zirconia particles, an organic acid, and water, as well as a method of using such a polishing composition to polish substrates and a method of using a polishing composition comprising zirconia particles, an organic acid, an oxidizing agent, and water to polishing substrates containing metal and oxide-based dielectric materials.

13 Claims, No Drawings

US 8,778,212 B2

CMP COMPOSITION CONTAINING ZIRCONIA PARTICLES AND METHOD OF USE

BACKGROUND OF THE INVENTION

Current advances in through-silicon via (TSV) technology allow for the production of a thinner, lighter, and smaller interconnected circuit for various electronic devices. Typically, TSVs are manufactured by dry etching a silicon dioxide-based dielectric material to form holes (i.e., vias) and trenches for vertical and horizontal interconnects prior to deposition of a metal, e.g., copper, onto the surface. Because copper has the property of being a fast diffuser and can move quickly through the underlying dielectric layer to poison the device, a diffusion layer is typically applied to the substrate before deposition of the copper. Chemical-mechanical polishing (CMP) is employed to reduce the thickness of the copper over-layer, as well as the thickness of the diffusion barrier layer, until a planar surface that exposes elevated portions of the dielectric surface is obtained. The vias and trenches remain filled with electrically conductive copper forming the circuit interconnects.

In order to precisely polish electronic component surfaces, it has become necessary to develop CMP compositions that are compatible with a combination of surfaces being polished. However, due to the significant difference in chemical reactivity of metal and oxide-based dielectric materials, conventional CMP compositions result in widely differing removal rates of substrates containing both metal and oxide-based dielectric materials, which can result in the over-polishing of one layer and overall inefficiency.

Thus, there remains a need in the art for improved CMP compositions and CMP methods for substrates comprising both metal and oxide-based dielectric layers. Particularly, there exists a need for CMP compositions with tunable selectivities, allowing the end-user to easily optimize polishing performance for specific substrates. In addition, a need exists for CMP compositions and methods capable of being tuned by the end-user to non-selectively remove a metal layer and a dielectric layer with nearly equal polishing rates during a single CMP step.

BRIEF SUMMARY OF THE INVENTION

The invention provides a chemical-mechanical polishing (CMP) composition comprising (a) zirconia particles, (b) a modifying agent that adheres to the zirconia particles, (c) an organic acid comprising at least one of an amino acid and an alkylcarboxylic acid, and (d) water.

The invention provides a method of chemically-mechanically polishing a substrate, which comprises (i) contacting a substrate with a polishing pad and a CMP composition comprising (a) zirconia particles, (b) a modifying agent that adheres to the zirconia particles, (c) an organic acid comprising at least one of an amino acid and an alkylcarboxylic acid, and (d) water, (ii) moving the polishing pad relative to the substrate with the CMP composition therebetween, and (iii) abrading at least a portion of the substrate to polish the substrate.

The invention provides a method of chemically-mechanically polishing a substrate, which method comprises (i) contacting a substrate comprising at least one layer of metal and at least one layer of oxide-based dielectric with a polishing pad and a CMP composition, (ii) moving the polishing pad relative to the substrate with the CMP composition therebetween, and (iii) abrading at least a portion of the metal layer and the oxide-based dielectric layer to polish the substrate, wherein the CMP composition comprises (a) zirconia particles, (b) an oxidizing agent comprising at least one of hydrogen peroxide, ammonium iodate, and ammonium persulfate, (c) an organic acid comprising at least one of an amino acid and an alkylcarboxylic acid, and (d) water.

DETAILED DESCRIPTION OF THE INVENTION

The invention provides a CMP composition comprising, consisting essentially of, or consisting of (a) zirconia particles, (b) optionally a modifying agent that adheres to the zirconia particles, (c) an organic acid comprising at least one of an amino acid and an alkylcarboxylic acid, and (d) water.

The CMP composition comprises zirconia particles. The zirconia particles can be any suitable particles of zirconia, i.e., zirconium dioxide. The zirconia particles, for example, can be fumed (pyrogenic) zirconia particles, precipitated zirconia particles, or condensation-polymerized zirconia particles.

The zirconia particles can have any suitable particle size. The particle size of an approximately spherical particle is the diameter of the particle. The particle size of a non-spherical particle is the diameter of the smallest sphere that encompasses the particle. The zirconia particles can have an average particle size (e.g., average particle diameter) of 20 nm or more, 30 nm or more, 40 nm or more, 50 nm or more, or 75 nm or more. Alternatively, or in addition, the zirconia particles can have an average particle size of 500 nm or less, 400 nm or less, 300 nm or less, 250 nm or less, or 200 nm or less. Thus, the zirconia particles can have an average particle size bounded by any two of the above endpoints. For example, the zirconia particles can have an average particle size of 20-500 nm, 30-500 nm, 30-400 nm, 50-300 nm, 50-250 nm, 75-250 nm, or 75-200 nm.

Preferably, the zirconia particles are colloidally stable within the CMP composition. The term colloid refers to the suspension of particles in the liquid carrier (e.g., water). Colloidal stability refers to the maintenance of that suspension through time. In the context of this invention, zirconia particles are considered colloidally stable if, when the zirconia particles are placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $\{[B]-[T]\}/[C]$ is less than or equal to 0.3, and most preferably is less than or equal to 0.1.

The CMP composition can contain any suitable amount of the zirconia particles. The CMP composition can contain 0.01 wt % or more, 0.1 wt % or more, 0.5 wt % or more, or 1.0 wt % or more, of the zirconia particles, based on the total weight of the composition. Alternatively, or in addition, the CMP composition can contain 5 wt % or less, 3 wt % or less, or 2 wt % or less of the zirconia particles. Thus, the zirconia particles can be present in the composition in an amount bounded by any two of the above endpoints. For example, the zirconia particles can be present in the composition in an amount of 0.01-5 wt %, 0.5-2 wt %, 0.1-3 wt %, or 1-3 wt %.

The CMP composition optionally, but preferably, comprises a modifying agent that adheres to the zirconia particles. The CMP composition can contain any suitable amount of the modifying agent that adheres to the zirconia particles. The term "adheres" includes any suitable means for the modifying agent to be connected to a zirconia particle. Such suitable means include by one or more covalent bonds, one or more electrostatic bonds, one or more hydrogen bonds, one or more Van der Waals bonds, and combinations thereof.

The modifying agent can comprise an aminoalkylsilane. Suitable aminoalkylsilanes include, but are not limited to, (3-aminoalkyl)alkoxysilane (e.g., (3-aminopropyl)triethoxysilane, (3-aminopropyl)trimethoxysilane, (3-aminopropyl)diethoxymethoxysilane, and (3-aminopropyl)dimethoxyethoxysilane); (N,N-alkylaminopropyl)trialkoxysilane (e.g., (N,N-dimethylaminopropyl)trimethoxysilane, (N,N-diethylaminopropyl)trimethoxysilane, (N,N-dimethylaminopropyl)triethoxysilane, and (N,N-ethylmethylaminopropyl)trimethoxysilane); (N-alkylaminopropyl)alkoxysilane (e.g., (N-methylaminopropyl)trimethoxysilane and (N-ethylaminopropyl)triethoxysilane); (N,N,N-trimethylaminopropyl)trimethoxysilane; and bis(trialkoxysilylalkyl)amine (e.g., bis(trimethoxysilylpropyl)amine and bis(triethoxysilylpropyl)amine).

The modifying agent can comprise a phosphonic acid. Preferably, the phosphonic acid comprises at least one of an alkylphosphonic acid (e.g., methylphosphonic acid) and an aminoalkylphosphonic acid (e.g., aminoethylphosphonic acid). Useful phosphonic acids include but are not limited to aminotris(methylenephosphonic acid), N-carboxymethylaminomethanephosphonic acid, 1-hydroxyethylidene-1,1-diphosphonic acid, dialkyl phosphonates, dialkylalkylphosphonates, and mixtures thereof.

The modifying agent can comprise dialkylsulphoxide (e.g., dimethylsulphoxide), dialkylsulphone (e.g., dimethylsulphone), and an alkylsulphonic acid (e.g., methylsulphonic acid).

The modifying agent can comprise a combination of an aminosilane and phosphonic acid, e.g., bis(trimethoxysilylpropyl)amine and aminoethyl phosphonic acid. When the modifying agent comprises an alkylaminosilane and substantially no alkylphosphonic acid, the zeta potential of the CMP composition is positive, but the resulting oxidizing agent decomposition inhibits high removal rates of the substrate. A positive zeta potential corresponds to a colloidally stable CMP composition which allows a longer pot life. In contrast, when the modifying agent comprises an alkylphosphonic acid and substantially no alkylaminosilane, decomposition of the oxidizing agent is prevented; however, the zeta potential of the CMP composition is negative. When the modifying agent comprises both an alkylaminosilane and an alkylphosphonic acid, the CMP solution is stable, decomposition of the oxidizing agent is prevented, and high removal rates of the substrate are achieved.

The CMP composition can contain any suitable amount of the modifying agent. The modifying agent can be present in the composition in an amount of 0.001 wt % or more, 0.01 wt % or more, 0.05 wt % or more, or 0.1 wt % or more, based on the total weight of the composition. Alternatively, or in addition, the modifying agent can be present in the composition in an amount of 5 wt % or less, 3 wt % or less, or about 1 wt % or less, based on the total weight of the composition. Thus, the modifying agent can be present in the polishing composition in an amount bounded by any two of the above endpoints. For example, the modifying agent may be present in the polishing composition in an amount of 0.001-5 wt %, 0.01-3 wt %, 0.05-1 wt %, or 0.1-1 wt %.

The CMP composition comprises an organic acid. The organic acid can be any suitable organic acid but desirably is a carboxylic acid substituted with groups selected from the group consisting of $C_1$-$C_{12}$ alkyl, amino, substituted amino (e.g., methylamino, dimethylamino, and the like), hydroxyl, halogen, and combinations thereof. Preferably, the organic acid is an alkylcarboxylic acid, an amino acid, or a combination thereof. Non-limiting examples of suitable alkylcarboxylic acids include acetic acid, malonic acid, lactic acid, malic acid, tartaric acid, acetohydroxamic acid, glycolic acid, benzilic acid, and salicyclic acid. Non-limiting examples of suitable amino acids include glycine, alanine, proline, lysine, cysteine, leucine, aspartic acid, and glutamic acid.

The CMP composition can contain any suitable amount of the organic acid. The organic acid can be present in the composition in an amount of 0.001 wt % or more, 0.01 wt % or more, 0.05 wt % or more, 0.1 wt % or more, or 0.5 wt % or more, based on the total weight of the composition. Alternatively, or in addition, the organic acid can be present in the composition in an amount of 5 wt % or less, 3 wt % or less, or 1 wt % or less, based on the total weight of the composition. Thus, the organic acid can be present in the composition in an amount bounded by any two of the above endpoints. For example, the organic acid can be present in the composition in an amount of 0.01-5 wt %, 0.05-1 wt %, 0.1-1 wt %, or 0.5-1 wt %.

The CMP composition comprises water. The water is used to facilitate the application of the zirconia particles and other components of the polishing composition to the surface of a suitable substrate to be polished or planarized. Preferably, the water is deionized water.

The CMP composition can comprise an oxidizing agent. The oxidizing agent is a substance that oxidizes metal, e.g., copper and/or tantalum. Preferably, the oxidizing agent is at least one of hydrogen peroxide, ammonium persulfate, hydroxylamine, and ammonium iodate.

The CMP composition can contain any suitable amount of the oxidizing agent. The oxidizing agent can be present in the composition in an amount of 0.01 wt % or more, 0.5 wt % or more, 0.1 wt % or more, 1 wt % or more, or 1.5 wt % or more, based on the total weight of the composition. Alternatively, or in addition to, the oxidizing agent can be present in the composition in an amount of 10 wt % or less, 5 wt % or less, 3 wt % or less, 2 wt % or less, or 1.5 wt % or less, based on the total weight of the composition. Thus, the oxidizing agent can be present in the composition in an amount bounded by any two of the above endpoints. For example, the oxidizing agent can be present in the composition in an amount of 0.01-10 wt %, 0.5-5 wt %, 0.1-3 wt %, 1.5-3 wt %, or 1.5-2 wt %.

The CMP composition optionally comprises a nitrogen-containing heterocyclic compound. The term nitrogen-containing heterocyclic compound as used herein refers to a 5-, 6-, or 7-membered ring compound having one or more nitrogen atoms contained as part of the ring system. The nitrogen containing heterocyclic compound can be benzotriazole (BTA). The nitrogen-containing heterocyclic compound can be an aminotriazole. Non-limiting examples of suitable aminotriazoles include 3-amino-1,2,4-triazole, 3-amino-1,2,4-triazole-5-carboxylic acid, 3-amino-5-mercapto-1,2,4-triazole, and 4-amino-5-hydrazino-1,2,4-triazole-3-thiol. The nitrogen-containing heterocyclic compound can be a thiazole. Non-limiting examples of suitable thiazoles include 2-amino-5-methylthiazole, 2-amino-4-thoazoleacetic acid, and thiazole. The nitrogen-containing heterocyclic compound can be a heterocyclic N-oxide. Non-limiting examples of suitable heterocyclic N-oxides include 2-hydroxypyridine-N-oxide, 4-methylmorpholine-N-oxide, and picolinic acid N-oxide.

The CMP composition can contain any suitable amount of the nitrogen-containing heterocyclic compound. The nitrogen-containing heterocyclic compound can be present in the composition in an amount of 0.02 wt % or more, 0.05 wt % or more, 0.1 wt % or more, or 0.5 wt % or more, based on the total weight of the composition. Alternatively, or in addition, the nitrogen-containing heterocyclic compound can be present in the composition in an amount of 5 wt % or less, 4 wt % or less, 3 wt % or less, 2 wt % or less, or 1 wt % or less, based on the total weight of the composition. Thus, the nitrogen-containing heterocyclic compound can be present in the composition in an amount bounded by any two of the above endpoints. For example, the nitrogen-containing heterocyclic compound can be present in the composition in an amount of 0.02-4 wt %, 0.05-2 wt %, 0.1-1 wt %, or 0.5-2 wt %.

The CMP composition optionally comprises one or more other additives. Such additives include surfactants and/or rheological control agents, antifoaming agents, and biocides. Additives can be present in the CMP composition at any suitable concentrations.

The CMP composition can have any suitable pH. The CMP composition can have a pH of 4 or more, 4.5 or more, 5 or more, 5.5 or more, or 6 or more. The composition can have a pH of 8 or less, 7 or less, 6 or less, or 6.5 or less. The pH of the composition can be bounded by any of the two above end points. For example, the pH of the composition can be 4-7, 4-6, or 5-6.5. The pH of the CMP composition can be achieved and/or maintained by any suitable means. The CMP composition can further comprise a pH adjustor, a pH buffering agent, or combination thereof. The pH adjustor can be any suitable pH-adjusting compound. For example, the pH adjustor can be any suitable acid or base strong enough to produce the desired final pH. Examples of suitable acids include nitric acid, acetic acid, phosphoric acid, and the like. Examples of suitable bases include potassium hydroxide, ammonium hydroxide, and tetraalkylammonium hydroxide. The pH buffering agent can be any suitable buffering agent, for example, phosphates, acetates, borates, ammonium salts, and the like. Many such pH buffering systems are well known in the art. The pH buffering agent can be any suitable buffering agent, for example, bicarbonate-carbonate buffer systems, aminoalkylsulfonic acids, and the like. The CMP composition can comprise any suitable amount of a pH adjustor and/or a pH buffering agent, provided that a suitable amount is used to achieve and/or maintain the pH of the CMP composition within a suitable range.

The CMP composition can be supplied as a one-package system comprising zirconia particles, organic acid, modifying agent, and oxidizing agent in an aqueous medium. Alternatively, the zirconia particles, organic acid, and modifying agent may be supplied in a first container, and the oxidizing agent can be supplied in a second container as a solution in water or in a solid form. For example, hydrogen peroxide is desirably supplied separately from the other components of the CMP composition and is combined, e.g., by the end-user, with the other components of the CMP composition shortly before use (e.g., 1 week or less prior to use, 1 day prior to use, 1 hour prior to use, 10 minutes prior to use, 1 minute prior to use) or directly at the point-of-use. Other two-container or three or more container systems are within the knowledge of one of ordinary skill in the art.

In order to mix components contained in storage devices to produce the CMP composition at or near the point-of-use, the storage devices typically are provided with one or more flow lines leading from each storage device to the point-of-use of the CMP composition (e.g., the platen, the polishing pad, or the substrate surface). As utilized herein, the term "point-of-use" refers to the point at which the CMP composition is applied to the substrate surface (e.g., the polishing pad or the substrate surface itself). If the CMP composition is to be produced using point-of-use mixing, the components of the CMP composition are separately stored in two or more storage devices, as appropriate. By the term "flow line" is meant a path of flow from an individual storage container to the point-of-use of the component stored therein. The one or more flow lines can each lead directly to the point-of-use, or, in the situation that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the CMP composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if they are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less, or even simultaneous to the delivery of the components at the point-of-use (e.g., the components are combined at a dispenser). Components also are combined "immediately before delivery to the point-of-use" if they are combined within 5 m of the point-of-use, such as within 1 in of the point-of-use or even within 10 cm of the point-of-use (e.g., within 1 cm of the point-of-use).

When two or more of the components of the CMP composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The CMP composition can also be provided as a concentrate which is intended to be diluted with an appropriate amount of water prior to use. Preferably, the oxidizing agent is provided separately and not as a component of the concentrate. As will be understood by one skilled in the art, the amount of zirconia particles, organic acid, and modifying agent present in the concentrate are such that, upon dilution, e.g., with water and/or oxidizing agent, the amount of each component is within the appropriate recited range above. In addition, the concentrate can contain an appropriate amount of water present in the final CMP composition in order to ensure that the components of the concentrate are at least partially or fully dissolved in the concentrate.

The invention provides a method of chemically-mechanically polishing a substrate comprising (i) contacting a substrate with a polishing pad and a CMP composition described herein, (ii) moving the polishing pad relative to the substrate with the polishing composition therebetween, and (iii) abrading at least a portion of the substrate to polish the substrate.

The method can be used to polish any suitable substrate and is especially useful for polishing substrates comprising at least one layer (typically a surface layer) comprised of a metal and an oxide-based dielectric material. Suitable substrates include wafers used in the semiconductor industry. The wafers typically comprise or consist of, for example, a metal, metal oxide, metal nitride, metal composite, metal alloy, a low dielectric material, or combinations thereof.

The invention also provides a method of chemically-mechanically polishing a substrate comprising (i) contacting a substrate comprising at least one layer of metal and at least one layer of oxide-based dielectric with a polishing pad and a CMP composition, as disclosed herein, (ii) moving the polishing pad relative to the substrate with the CMP composition therebetween, and (iii) abrading at least a portion of the metal layer and at least a portion of the oxide-based dielectric layer to polish the substrate. The method comprises a CMP composition comprising (a) zirconia particles, (b) an oxidizing agent comprising at least one of hydrogen peroxide, ammonium iodate, ammonium persulfate, and hydroxylamine, (c) an organic acid comprising at least one of an amino acid and an alkylcarboxylic acid, and (d) water. The CMP composition can further comprise a modifying agent that adheres to the zirconia particles and/or any other component as described herein.

The substrate can comprise at least one copper layer and at least one silicon dioxide-based dielectric material layer. The silicon dioxide-based dielectric layer can be derived from any suitable precursor. Preferably, the silicon dioxide-based dielectric layer is derived from silane precursors, more preferably from oxidized silane precursors, such as tetraethylorthosilicate (TEOS). The silicon dioxide-based dielectric layer can include but is not limited to borophosphosilicate glass (BPSG), PETEOS, thermal oxide, undoped silicate glass, and HDP oxide. The substrate can further comprise at least one tantalum layer. The tantalum layer can comprise tantalum metal or can comprise a suitable tantalum-containing compound, such as tantalum nitride, or a mixture of tantalum metal and tantalum containing compound. The substrate can further comprise at least one nitride containing layer, such as silicon nitride.

Advantageously, the methods of the invention allow for control of the selectivity for the polishing of a substrate comprising at least one metal layer and at least one silicon dioxide-based dielectric layer, and optionally a tantalum layer and/or nitride layer. Selectivity is defined herein as the ratio of the polishing rate of one layer compared to the polishing rate of a second, different layer. For example, for CMP compositions comprising zirconia particles, organic acid, hydrogen peroxide and water, a decrease in organic acid from 0.9 wt % to 0.1 wt % increases the selectivity of the CMP composition for TEOS over copper. In contrast, an increase in organic acid from 0.1 wt % to 0.9 wt % decreases the selectivity for TEOS over copper, i.e., providing a CMP composition that is equally effective at polishing TEOS and copper. Further examples of selectivity are discussed in the Examples below.

The CMP composition and methods of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the CMP composition of the invention, and then the polishing pad moving relative to the substrate, so as to abrade at least a portion of the substrate to polish the substrate.

A substrate can be polished with the CMP composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical polishing pads include, but are not limited to, SURFIN™ 000, SURFIN™ SSW1, SPM3100 (commercially available from Eminess Technologies), POLITEX™, and Fujibo POLYPAS™ 27 polishing pads. A particularly preferred polishing pad is the EPIC™ D100 polishing pad commercially available from Cabot Microelectronics.

Desirably, the chemical-mechanical polishing apparatus further comprises an in situ polishing endpoint detection system. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

EXAMPLES

The following examples further illustrate the invention but, of course, should not be construed as in any way limiting its scope.

The polishing experiments reflected in the examples involved the use of a commercially available polishing apparatus with 17.24 kPa (2.5 psi) downforce pressure of the substrate against an EPIC™ D100 polishing pad unless indicated otherwise, 120 rpm platen speed, and 114 rpm carrier speed. The polishing parameters included a diamond conditioner of A3700 (commercially available from 3M). The CMP compositions in the examples were mixed at the point-of-use. The zirconia particles used in the examples comprise undoped monoclinic zirconia.

Example 1

Compositions 1A-1I were prepared with zirconia particles, glycine, and hydrogen peroxide in the amounts indicated in Table 1, with the remainder water. Each of Compositions 1A-1I had a pH of about 5.7. Compositions 1A-1I were used to polish copper, silicon nitride, and TEOS substrates under similar polishing conditions. The removal rate (RR) of each substrate material for each composition was determined and is set forth in Table 1.

TABLE 1

| Composition | Zirconia (wt. %) | Glycine (wt. %) | H$_2$O$_2$ (wt. %) | Cu RR (Å/min) | Nitride RR (Å/min) | TEOS RR (Å/min) |
|---|---|---|---|---|---|---|
| 1A | 1 | 0.5 | 1 | 1900 | 750 | 3200 |
| 1B | 0.5 | 0.1 | 0.5 | 700 | 700 | 3250 |
| 1C | 1.5 | 0.1 | 0.5 | 1000 | 1100 | 4400 |
| 1D | 0.5 | 0.5 | 0.5 | 750 | 750 | 2600 |
| 1E | 1.5 | 0.5 | 0.5 | 1000 | 1250 | 3200 |
| 1F | 0.5 | 0.1 | 1.5 | 750 | 700 | 2800 |
| 1G | 1.5 | 0.1 | 1.5 | 1250 | 1000 | 3600 |
| 1H | 0.5 | 0.9 | 1.5 | 2400 | 700 | 2200 |
| 1I | 1.5 | 0.9 | 1.5 | 3250 | 1000 | 3050 |

As apparent from the data set forth in Table 1, the copper, nitride, and TEOS removal rates can be controlled by the amount of zirconia particles, i.e., an increased concentration of zirconia particles results in increased copper, nitride, and TEOS removal rates. For example, Compositions 1C, 1E, 1G, and 1I with 1.5 wt. % zirconia particles provided higher copper, nitride, and TEOS removal rates than otherwise identical Compositions 1B, 1D, 1F, and 1H, respectively, with 0.5 wt. % zirconia particles. As is also apparent from the data set forth in Table 1, an increase in the organic acid (specifically glycine) concentration can dramatically change the selectivity of the polishing composition. For example, Compositions 1F and 1G with 0.1 wt. % glycine were reasonably selective for TEOS over copper (such that the TEOS removal rates were approximately three times as great as the copper removal rates), whereas otherwise identical Compositions 1H and 1I, respectively, with 0.9 wt. % glycine exhibited similar removal rates for TEOS and copper (indeed, slightly higher copper removal rates than TEOS removal rates). A similar but less dramatic effect is apparent in the comparison of Compositions 1B and 1C with 0.1 wt. % glycine and otherwise identical Compositions 1D and 1E, respectively, with 0.5 wt. % glycine.

Example 2

Compositions 2A-2D were prepared with 1 wt % zirconia particles, 30 ppm acetic acid, 300 ppm BTA, and one or more oxidizers in the amounts indicated in Table 2, with the remainder water. In addition Composition 2A included 0.1 wt. % glycine, which was not present in Compositions 2B-2D. Each of Compositions 2A-2D had a pH of about 5.7. Compositions 2A-2D were used to polish copper, nitride, tantalum, and TEOS substrates under similar polishing conditions. The removal rate (RR) of each substrate material for each composition was determined and is set forth in Table 2.

TABLE 2

| Composition | Oxidizer(s) | Glycine (wt. %) | Cu RR (Å/min) | Nitride RR (Å/min) | Ta RR (Å/min) | TEOS RR (Å/min) |
|---|---|---|---|---|---|---|
| 2A | 1.0 wt. % H$_2$O$_2$ | 0.1 | 900 | 1000 | 400 | 3600 |
| 2B | 0.1 wt. % hydroxylamine | 0 | 600 | 1250 | 700 | 4100 |
| 2C | 1.0 wt. % H$_2$O$_2$ 0.1 wt. % hydroxylamine | 0 | 1100 | 1600 | 1000 | 2800 |
| 2D | 1.0 wt. % H$_2$O$_2$ 0.2 wt. % 2-hydroxylpyridine | 0 | 750 | 1000 | 250 | 3400 |

As is apparent from the data set forth in Table 2, the copper, nitride, tantalum, and TEOS removal rates can be controlled by the amount and choice of oxidizer. For example, the removal rates for copper, nitride and tantalum can be increased by using a combination of hydrogen peroxide and hydroxylamine. For example, Composition 2C with 1.0 wt. % hydrogen peroxide and 0.1 wt. % hydroxylamine had significantly higher removal rates for copper, nitride, and tantalum compared to Compositions 2A and 2B, which contained only hydrogen peroxide or hydroxylamine. Importantly, the use of hydroxylamine in combination with hydrogen peroxide in Composition 2C resulted in an increased removal rate for tantalum and a decrease in removal rate for TEOS. Also, as apparent from the data in Table 2, the use of hydroxylpyridine in place of hydroxylamine decreases the removal rates for copper, nitride and tantalum, but increases the removal rate of TEOS.

Example 3

Compositions 3A-3D were prepared with 1 wt. % ZrO$_2$, 275 ppm bis(trimethoxysilylpropyl)amine, 1 wt. % hydrogen peroxide, and glycine in the amounts indicated in Table 3, with the remainder water. Each of Compositions 3A-3D had a pH of about 5. These compositions then were used to polish copper, tantalum, and TEOS substrates under similar polishing conditions. The removal rate (RR) of each substrate material for each composition was determined and is set forth in Table 3.

TABLE 3

| Composition | Glycine (wt %) | Cu RR (Å/min) | Ta RR (Å/min) | TEOS RR (Å/min) |
|---|---|---|---|---|
| 3A | 0.05 | 914 | — | 3022 |
| 3B | 0.5 | 4485 | 107 | 2195 |
| 3C | 1.00 | 5428 | 100 | 1988 |
| 3D | 1.50 | Cleared | 91 | 1603 |

"Cleared" indicates the substrate was quickly and completely removed by the polishing such that the removal rate was not measured but is known to have been greater than 5500 Å/min.

As apparent from the data set forth in Table 3, the copper, tantalum, and TEOS removal rates can be controlled by the amount of organic acid (specifically glycine) used in combination with a modifying agent (specifically aminosilane). For example, as the concentration of glycine increases and the concentration of aminosilane is constant, the removal rate for copper also increases, as evidenced by the removal rate results observed with respect to Compositions 3A-3C. In contrast, as the glycine concentration increases and the aminosilane concentration is constant, the TEOS removal rates decrease, as evidenced by the removal rates observed with respect to Compositions 3A-3D. The data set forth in Table 3 demonstrates that an increase in the organic acid concentration can dramatically change the selectivity of the polishing composition. For example, Composition 3A, which contained 0.05 wt. % glycine, had a relatively high selectivity for TEOS over copper, whereas Composition 3B, which contained 0.5 wt. % glycine, was more selective for copper over TEOS. Moreover, Compositions 3C and 3D, which contained 1.0 wt. % and 1.5 wt. % glycine, respectively, had high selectivities for copper over TEOS.

Example 4

Compositions 4A-4C were prepared with 1 wt % $ZrO_2$, 275 ppm bis(trimethoxysilylpropyl)amine, either 0.15 wt. % glycine (Compositions 4A and 4B) or 0.10 wt. % glycine (Composition 4C), and an oxidizing agent of the type and in the amounts indicated in Table 4, with the remainder water. Composition 4C further comprised 0.1 wt. % benzotriazole (BTA). Each of Compositions 4A-4C had a pH of about 5. These compositions then were used to polish copper, nitride ($Si_3N_4$), borophosphosilicate (BPGS), and TEOS substrates under similar polishing conditions. The removal rate (RR) of each substrate material for each composition was determined and is set forth in Table 4.

TABLE 4

| Composition | Oxidizing Agent | Cu RR (Å/min) | Nitride RR (Å/min) | TEOS RR (Å/min) | BPGS RR (Å/min) | Partially Cured Polyimide (Å/min) | Fully Cured Polyimide (Å/min) |
|---|---|---|---|---|---|---|---|
| 4A | 0.2 wt. % $NH_4IO_3$ | 1267 | 1501 | 2503 | 4118 | 9771 | 6995 |
| 4B | 0.1 wt. % $(NH_4)_2S_2O_8$ | 1832 | 1648 | 2079 | 4394 | 7774 | — |
| 4C | 1.0 wt. % $H_2O_2$ | 459 | 1711 | 3436 | 5645 | 5529 | 3981 |

As apparent from the data set forth in Table 4, the copper, nitride, TEOS, BPGS, and polyimide removal rates can be controlled by the type of oxidizing agent. For example, Compositions 4A-4C have a high selectivity for BPGS and partially cured polyimide over copper, nitride and TEOS. However, Composition 4A, which contained $NH_4IO_3$ as the oxidizing agent, demonstrated a higher selectivity of TEOS over copper. Further, Composition 4C, which contained $H_2O_2$ as the oxidizing agent, demonstrated even higher selectivity of TEOS over copper and nitride than Composition 4A. In contrast, Composition 4B, which contained $(NH_4)_2S_2O_8$ as the oxidizing agent, was only slightly selective of TEOS over copper and nitride (i.e., Composition 4B was relatively equally effective at polishing TEOS, copper, and nitride).

Example 5

The composition of Example 5 was prepared with 1 wt % $ZrO_2$, 0.2 wt % $NH_4IO_3$, 275 ppm bis(trimethoxysilylpropyl)amine, and 0.15 wt % glycine, with the remainder water. The composition had a pH of about 5. The composition was used to polish copper and TEOS substrates under similar polishing conditions at different times after the preparation of the composition as indicated in Table 5. The removal rate (RR) of each substrate material for the composition was determined and is set forth in Table 5.

TABLE 5

| Days | Cu RR (Å/min) | TEOS RR (Å/min) |
|---|---|---|
| 0 | 1250 | 2500 |
| 2 | 900 | 2600 |
| 5 | 1500 | 2700 |

As apparent from the data set forth in Table 5, the polishing effectiveness of the composition remained essentially unchanged over the course of 5 days, thereby confirming the stability of the composition, i.e., good pot life of the composition.

Example 6

Compositions 6A-6J were prepared with 2 wt % $ZrO_2$, 550 ppm aminosilane, 0.06 wt % BTA, 0.10 wt % glycine, an aminosilane in the amounts indicated in Table 6, and with and without 2 wt % hydrogen peroxide as indicated in Table 6, with the remainder water. Each of Compositions 6A-6J had a pH of about 5.8. These compositions then were used to polish nitride and TEOS substrates under similar polishing conditions. The removal rate (RR) of each substrate material for each composition was determined and is set forth in Table 6.

TABLE 6

| Composition | $H_2O_2$ (wt. %) | Aminosilane | Nitride RR (Å/min) | TEOS RR (Å/min) |
|---|---|---|---|---|
| 6A | 0 | (N-methyl-3-aminopropyl)trimethoxysilane | 966 | 1295 |
| 6B | 2 | (N-methyl-3-aminopropyl)trimethoxysilane | 961 | 1729 |
| 6C | 0 | (N,N-dimethyl-3-aminopropyl)trimethoxysilane | 934 | 1643 |
| 6D | 2 | (N,N-dimethyl-3-aminopropyl)trimethoxysilane | 614 | 1656 |
| 6E | 0 | Aminopropyltrimethoxysilane | 912 | 1372 |
| 6F | 2 | Aminopropyltrimethoxysilane | 643 | 1611 |
| 6G | 0 | (N,N,N-trimethyl-3-aminopropyl)trimethoxysilane | 1473 | 1558 |
| 6H | 2 | (N,N,N-trimethyl-3-aminopropyl)trimethoxysilane | 810 | 2814 |
| 6I | 0 | Bis(trimethoxysilylpropyl)amine | 1735 | 1921 |
| 6J | 2 | Bis(trimethoxysilylpropyl)amine | 1474 | 3330 |

As apparent from the data set forth in Table 6, the nitride and TEOS removal rates can be controlled by the type of aminosilane used in the compositions. For example, higher removal rates are achieved by using the aminosilane bis(trimethoxysilylpropyl)amine (Compositions 6I and 6J) than (N-methyl-3-aminopropyl)trimethoxysilane (Compositions 6A and 6B). Also apparent from the data in Table 6 is that the presence of hydrogen peroxide with the aminosilane increases the selectivity of TEOS over nitride. For example, Composition 6H, which contained (N,N,N-trimethyl-3-aminopropyl)trimethoxysilane as the aminosilane in combination with hydrogen peroxide, had a high selectivity for TEOS over nitride (2814/810=3.47), whereas Composition 6G, which was identical to Composition 6H except for lacking hydrogen peroxide, had a much lower selectivity of TEOS over nitride (1558/1473=1.06).

Example 7

Three groups of compositions were prepared with 2 wt % $ZrO_2$, 0.1 wt % glycine, 60 ppm acetic acid, 300 ppm BTA, and either 50 or 100 ppm bis(trimethoxysilylpropyl)amine (BTMSPA) or 50 ppm imidazole-propyltriethoxysilane (IPTES), with the remainder water. Each group of compositions had a different pH as indicated in Table 7. These compositions then were used to polish nitride and TEOS substrates under similar polishing conditions. The removal rate (RR) of each substrate material for each composition was determined and is set forth in Table 7.

TABLE 7

| | TEOS RR (Å/min) | | | Nitride RR (Å/min) | | |
| --- | --- | --- | --- | --- | --- | --- |
| pH | BTMSPA (100 ppm) | BTMSPA (50 ppm) | IPTES (50 ppm) | BTMSPA (100 ppm) | BTMSPA (50 ppm) | IPTES (50 ppm) |
| 5.75 | 3725 | 3615 | 3530 | 1179 | 1084 | 1020 |
| 5.0 | 3545 | 3545 | 3365 | 1295 | 1280 | 1070 |
| 4.3 | 1780 | — | 2190 | 989 | — | — |

As demonstrated by the data set forth in Table 7, the pH and particular aminosilane affects the removal rates for substrates comprising nitride and TEOS. For example, the removal rate of TEOS decreases as the pH decreases from 5.75 to 4.3. In contrast, the removal rate of nitride slightly increases with a decrease in pH from 5.75 to 5.0.

Example 8

Compositions 8A-8C were prepared with 2 wt. % $ZrO_2$, 1.5 wt. % $H_2O_2$, and 150 ppm BTA, as well as glycine, bis(trimethoxysilylpropyl)amine (BTMSPA), and aminoethylphosphonic acid in the amounts indicated in Table 8, with the remainder water. Each of Compositions 8A-8C had a pH of about 5.7. The hydrogen peroxide concentration was measured using titration with potassium permanganate in acidic solution. The zeta potential for each composition was determined and is set forth in Table 8A. These compositions then were used to polish copper, nitride, tantalum, and TEOS substrates under similar polishing conditions. The removal rate (RR) of each substrate material for each composition was determined and is set forth in Table 8B.

TABLE 8A

| Composition | Glycine (wt. %) | BTMSPA (ppm) | Aminoethyl-phosphonic Acid (ppm) | Zeta Potential without $H_2O_2$ (mV) | Zeta Potential with $H_2O_2$ (mV) | $H_2O_2$ Immediately After Polishing (wt %) | $H_2O_2$ 1 Day After polishing (wt %) |
| --- | --- | --- | --- | --- | --- | --- | --- |
| 8A | 0.9 | 550 | 50 | 34.5 | 15.3 | 1.5 | 0.90 |
| 8B | 0.9 | 550 | 100 | 33.7 | 19.8 | 1.5 | 1.03 |
| 8C | 1.8 | 0 | 100 | 46.7 | 3.0 | 1.5 | 1.03 |

TABLE 8B

| Composition | Glycine (wt. %) | BTMSPA (ppm) | Aminoethyl-phosphonic Acid (ppm) | Cu RR (Å/min) | Ta RR (Å/min) | Nitride RR (Å/min) | TEOS RR (Å/min) |
| --- | --- | --- | --- | --- | --- | --- | --- |
| 8A | 0.9 | 550 | 50 | 2600 | 490 | 1700 | 3500 |
| 8B | 0.9 | 550 | 100 | 2400 | 495 | 1750 | 3500 |
| 8C | 1.8 | 0 | 100 | 4250 | 250 | 1200 | 4000 |

As apparent from the data set forth in Table 8, the copper, tantalum, nitride, and TEOS removal rates can be controlled by the relative amounts of aminosilane and phosphonic acid. For example, Composition 8C, which contained aminoethylphosphonic acid without an aminosilane, was equally effective at removing copper and TEOS, but had lower removal rates for tantalum and nitride. Compositions 8A and 8B, which contained a combination of aminoethylphosphonic acid and BTMSPA, demonstrate relatively high removal rates for copper, tantalum, nitride and TEOS. In addition, Compositions 8A-8C maintained positive zeta potentials with the addition of hydrogen peroxide, which indicates a colloidally stable composition. In addition, the amount of hydrogen peroxide remaining in solution after 1 day was only slightly less than the amount after polishing, which indicates little decomposition of the oxidizing agent.

Example 9

Compositions 9A-9C were prepared with 1 wt % $ZrO_2$, 0.5 wt % glycine, 1 wt % $H_2O_2$, bis(trimethoxysilylpropyl)amine (BTMSPA) in the amounts indicated in Table 9A, 100 ppm of either phosphoric acid (PA) or methane phosphonic acid (MPA) as indicated in Table 9A, and 150 ppm BTA, with the remainder water. Each of Compositions 9A-9C had a pH of about 5.7. The zeta potential for each composition, prior to the addition of $H_2O_2$, was determined and is set forth in Table 9A. The compositions were used to polish copper, nitride, tantalum, and TEOS substrates under similar polishing conditions. The removal rate (RR) of each substrate material for each CMP composition was determined and is set forth in Table 9A. The peroxide decomposition data for Composition 9B is set forth in Table 9B.

TABLE 9A

| Composition | pH | BTMSPA (ppm) | PA or MPA | Zeta Potential without $H_2O_2$ (mV) | Cu RR (Å/min) | Nitride RR (Å/min) | Ta RR (Å/min) | TEOS RR (Å/min) |
|---|---|---|---|---|---|---|---|---|
| 9A | 5.0 | 100 | PA | −9.5 | — | 260 | — | 500 |
| 9B | 5.0 | 100 | MPA | 19.0 | 3600 | 600 | 250 | 2000 |
| 9C | 6.4 | 0 | MPA | −7.6 | 4250 | 600 | 200 | 1100 |

TABLE 9B

| Days | $H_2O_2$ (wt %) |
|---|---|
| 0 | 1.03 |
| 3 | 0.66 |
| 4 | 0.45 |

As apparent from the data set forth in Table 9, the copper, tantalum, nitride, and TEOS removal rates can be controlled by the combination and type of phosphoric acid. For example, Composition 9C, which contained MPA in the absence of an aminosilane, exhibited a much higher selectivity of copper over TEOS as compared to Composition 9B, which contained a combination of MPA and BTMSPA. In addition, the amount of hydrogen peroxide remaining in the solution of Composition 9B after 3 and 4 days was only slightly less than the amount after polishing (i.e., 0 days), which indicates little decomposition of the oxidizing agent.

Example 10

Compositions 10A-10C were prepared with 1 wt % $ZrO_2$, 0.5 wt % glycine, 100 ppm BTMSPA, 1 wt % $H_2O_2$, 150 ppm BTA, and methane phosphonic acid (MPA) in the amounts indicated in Table 10, with the remainder water. Each of Compositions 10A-10C had a pH of about 5.7. The zeta potential for each composition was determined and is set forth in Table 10. These compositions then were used to polish copper, nitride, tantalum and TEOS substrates under similar polishing conditions. The removal rate (RR) of each substrate material for each composition was determined and is also set forth in Table 10.

TABLE 10

| Composition | MPA (ppm) | Zeta Potential without $H_2O_2$ (mV) | Cu RR (Å/min) | Nitride RR (Å/min) | Ta RR (Å/min) | TEOS RR (Å/min) |
|---|---|---|---|---|---|---|
| 10A | 100 | 19.6 | 2759 | 825 | 287.5 | 2624 |
| 10B | 500 | −3.9 | 2709 | 621 | 246 | 979 |
| 10C | 1000 | −3.3 | 2473 | 777 | 282 | 1219 |

As apparent from the data set forth in Table 10, the copper, tantalum, nitride, and TEOS removal rates can be controlled by the concentration of phosphoric acid in the composition. As the concentration of MPA in the composition increased, the zeta potential of the composition decreased, and the copper, nitride, and tantalum removal rates remained substantially unchanged or slightly decreased, while the TEOS removal rate significantly decreased.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing (CMP) composition comprising:
    (a) zirconia particles, wherein the zirconia particles are present in the CMP composition at a concentration of about 0.01 wt % to about 5 wt %;
    (b) a modifying agent that adheres to the zirconia particles, wherein the modifying agent comprises an aminosilane or a phosphonic acid;
    (c) an organic acid comprising an amino acid; and
    (d) water.

2. The CMP composition of claim 1, wherein the organic acid is present in the CMP composition at a concentration of about 0.001 wt % to about 5 wt %.

3. The CMP composition of claim 1, wherein the aminosilane is at least one of bis(trimethoxysilylpropyl)amine, aminopropyltrimethoxysilane, (N-methyl-3-aminopropyl)trimethoxysilane, (N,N-dimethyl-3-aminopropyl) trimethoxysilane, (N,N,N-trimethyl-3-aminopropyl) trimethoxysilane, N-(3-triethoxysilylpropyl)-4,5-dihydroimidaxole, and [3-(2-aminoethyl)aminopropyl] trimethoxysilane.

4. The CMP composition of claim 1, wherein the modifying agent comprises an aminosilane and an aminoalkylphosphonic acid.

5. The CMP composition of claim 1, wherein the modifying agent is present in the CMP composition at a concentration of about 0.001 wt % to about 5 wt %.

6. The CMP composition of claim 1 further comprising an oxidizing agent.

7. The CMP composition of claim 6, wherein the oxidizing agent is a substance that oxidizes at least one of copper and tantalum.

8. The CMP composition of claim 6, wherein the oxidizing agent is at least one of hydrogen peroxide, ammonium iodate, hydroxylamine, hydroxylpyridine, and ammonium persulfate.

9. The CMP composition of claim 6, wherein the oxidizing agent is present in the CMP composition at a concentration of about 0.01 wt % to about 5 wt %.

10. The CMP composition of claim 1 further comprising about 0.01 wt % to about 5 wt % of a triazole.

11. The CMP composition of claim 1, wherein the composition has a pH from about 3 to about 7.

12. A method of chemically-mechanically polishing a substrate, which method comprises:
    (i) contacting a substrate with a polishing pad and the CMP composition of claim 1;
    (ii) moving the polishing pad relative to the substrate with the CMP composition therebetween; and
    (iii) abrading at least a portion of the substrate to polish the substrate.

13. The method of claim 12, wherein the substrate comprises at least one layer of copper and at least one layer of a silicon dioxide-based dielectric, and at least a portion of the copper layer and at least a portion of the silicon dioxide-based dielectric layer are abraded to polish the substrate.

* * * * *